(12) United States Patent
Sung et al.

(10) Patent No.: US 9,312,445 B2
(45) Date of Patent: Apr. 12, 2016

(54) LED WITH MULTILAYER LIGHT EXTRACTOR HAVING A REFRACTIVE INDEX GRADIENT

(71) Applicant: LG INNOTEK CO., LTD., Seoul (KR)

(72) Inventors: Youn Joon Sung, Seoul (KR); Jung Hun Jang, Seoul (KR); Sung Hoon Jung, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/334,540

(22) Filed: Jul. 17, 2014

(65) Prior Publication Data

US 2015/0021620 A1    Jan. 22, 2015

(30) Foreign Application Priority Data

Jul. 18, 2013  (KR) .......................... 10-2013-0084635

(51) Int. Cl.
*H01L 33/32* (2010.01)
*H01L 33/36* (2010.01)
*H01L 33/00* (2010.01)
*H01L 33/22* (2010.01)

(52) U.S. Cl.
CPC .............. *H01L 33/32* (2013.01); *H01L 33/002* (2013.01); *H01L 33/36* (2013.01); *H01L 33/22* (2013.01)

(58) Field of Classification Search
CPC ....... H01L 33/32; H01L 33/22; H01L 33/002; H01L 33/36
USPC .......................................................... 257/76
See application file for complete search history.

(56) References Cited

U.S. PATENT DOCUMENTS

| 2004/0211969 | A1 | 10/2004 | Ishizaki | |
| 2008/0149916 | A1* | 6/2008 | Baba et al. | 257/13 |
| 2008/0173887 | A1* | 7/2008 | Baba | H01L 33/20 257/98 |
| 2009/0042325 | A1* | 2/2009 | Fujimoto | H01L 33/22 438/22 |
| 2009/0273003 | A1* | 11/2009 | Park | 257/99 |
| 2010/0148199 | A1 | 6/2010 | Kim et al. | 257/98 |
| 2010/0238963 | A1* | 9/2010 | Tanaka | 372/45.012 |
| 2011/0155999 | A1* | 6/2011 | Tansu et al. | 257/13 |
| 2012/0025233 | A1* | 2/2012 | Nishikawa et al. | 257/94 |

(Continued)

FOREIGN PATENT DOCUMENTS

| KR | 10-2012-0010437 | 2/2012 |
| KR | 10-2012-0065610 | 6/2012 |

OTHER PUBLICATIONS

Laws. G. M. et al: "Improved refractive index formulas for the $Al_xGa_{1-x}N$ and $In_yGa_{1-y}N$ alloys"; Journal of Applied Physics; vol. 89; No. 2; Jan. 15, 2001; pp. 1108-1115 (XP-012052760).

(Continued)

*Primary Examiner* — Peter Bradford
(74) *Attorney, Agent, or Firm* — Ked & Associates, LLP

(57) ABSTRACT

The light emitting device includes a first semiconductor layer, a second semiconductor layer and an active layer provided between the first semiconductor layer and the second semiconductor layer. A first light extraction layer is provided on the first semiconductor layer and includes a nitride semiconductor layer. The first light extraction layer includes a plurality of first layers. The refractive indexes of the first layers decrease with increasing distance from the first semiconductor layer.

19 Claims, 7 Drawing Sheets

(56) References Cited

U.S. PATENT DOCUMENTS

| | | | |
|---|---|---|---|
| 2012/0074455 A1* | 3/2012 | Lu et al. | 257/99 |
| 2012/0280247 A1* | 11/2012 | Cheah et al. | 257/76 |
| 2012/0286286 A1 | 11/2012 | Jung et al. | |
| 2012/0292649 A1 | 11/2012 | Sugiyama et al. | |
| 2014/0054633 A1* | 2/2014 | Kim | H01L 33/58 257/98 |
| 2014/0217355 A1* | 8/2014 | Kim et al. | 257/13 |
| 2015/0076468 A1* | 3/2015 | Yamaguchi et al. | 257/40 |

OTHER PUBLICATIONS

European Search Report dated Dec. 17, 2014 issued in Application No. 14177298.8.

* cited by examiner

LED WITH MULTILAYER LIGHT EXTRACTOR HAVING A REFRACTIVE INDEX GRADIENT

CROSS REFERENCE TO RELATED APPLICATION

This application claims priority under 35 U.S.C. §119 to Korean Patent Application No. 10-2013-0084635, filed in Korea on Jul. 18, 2013, which are hereby incorporated in its entirety by reference as if fully set forth herein.

BACKGROUND

1. Field

Embodiments relate to a light emitting device.

2. Background

Group III-V nitride semiconductors such as GaN possess superior physical and chemical properties and, as such, are considered as important materials for semiconductor optical devices such as light emitting diodes (LED), laser diodes (LD), solar batteries, or the like.

Since optical devices employing the Group III-V nitride semiconductors emit light in blue and green bands, and have high luminance and high reliability, the optical devices are considered as a constituent material of a light emitting device.

The luminous efficacy of a light emitting device is determined by internal quantum efficiency and light extraction efficiency (also known as external quantum efficiency).

Since a nitride semiconductor layer constituting the light emitting device has a large refractive index, compared to external atmosphere, a sealing material or a substrate, the critical angle determining the range of an incidence angle of light emitted may become smaller. Thus, a large portion of light generated in an active layer is totally reflected to inner surfaces of a nitride semiconductor layer and thereby, optical loss may occur and light extraction efficiency may reduce.

BRIEF DESCRIPTION OF THE DRAWINGS

The embodiments will be described in detail with reference to the following drawings in which like reference numerals refer to like elements wherein.

DETAILED DESCRIPTION

Figure 1:
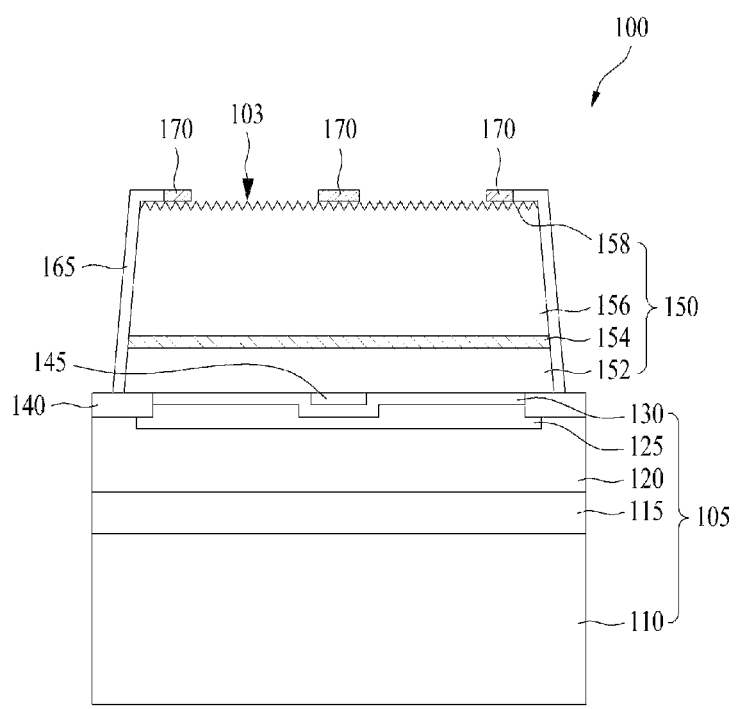
FIG. 1 is a sectional view of a light emitting device according to embodiments.

Hereinafter, embodiments will be described in detail with reference to the annexed drawings. In the following description of the embodiments, it will be understood that, when an element such as a layer (film), region, pattern, or structure is referred to as being "on" or "under" another element, it can be "directly" on or under another element or can be "indirectly" formed such that an intervening element is also present. Also, terms such as "on" or "under" should be understood on the basis of the drawings.

In the drawings, sizes may be exaggerated, omitted, or schematically illustrated for clarity and convenience of explanation. In addition, the size of each element does not wholly reflect an actual size thereof. The same reference numbers will be used throughout the drawings to refer to the same or like parts. Hereinafter, a light emitting device according to embodiments will be described with reference to the annexed drawings.

FIG. 1 is a sectional view of a light emitting device 100 according to an embodiment. Referring to FIG. 1, the light emitting device 100 includes a second electrode 105, a protective layer 140, a current blocking layer 145, a light emitting structure 150, a passivation layer 165 and a first electrode 170.

The second electrode 105 is disposed under the light emitting structure 150, namely, a second semiconductor layer 152. The second electrode 105, with the first electrode 170, supplies power to the light emitting structure 150. The second electrode 105 may include a supporting layer 110, a bonding layer 115, a barrier layer 120, a reflective layer 125 and an ohmic layer 130.

The supporting layer 110 supports the light emitting structure 150. The supporting layer 110 may be made of a metal or semiconductor material. In addition, the supporting layer 110 may be made of a material having superior electric and thermal conductivities. Namely, the supporting layer 110 may be a metal material including at least one of copper (Cu), copper alloy (Cu alloy), gold (Au), nickel (Ni), molybdenum (Mo) and copper-tungsten (Cu—W), or a semiconductor including at least one of Si, Ge, GaAs, ZnO and SiC.

The bonding layer 115 may be disposed between the supporting layer 110 and the barrier layer 120. The bonding layer 115 may function as a bonding layer bonding the supporting layer 110 and the barrier layer 120. The bonding layer 115 may include at least one metal, for example, In, Sn, Ag, Nb, Pd, Ni, Au and Cu. Since the bonding layer 115 is formed in order to bond the supporting layer 110 according to a bonding method, the bonding layer 115 may be omitted when the supporting layer 110 is formed by plating or deposition.

The barrier layer 120 may be disposed between the supporting layer 110 and reflective layer 115, and between the supporting layer 110 and the protective layer 140. Thus, diffusion of metal ions from the bond layer 115 and the supporting layer 110 through the reflective layer 125 and the ohmic layer 130 into the light emitting structure 150 may be prevented. For example, the barrier layer 120 may include at least one of barrier materials, for example, Ni, Pt, Ti, W, V, Fe and Mo, and have a single layer structure or a multi-layer structure.

The reflective layer 125 may be disposed on the barrier layer 120. The reflective layer 125 reflects light incident from the light emitting structure 150 and, as such, light extraction efficiency may be improved. The reflective layer 125 may be made of a metal or an alloy including at least one of light reflecting materials, for example, Ag, Ni, Al, Rh, Pd, Ir, Ru, Mg, Zn, Pt, Au and Hf.

The reflective layer 125 may have a multi-layer structure, for example, IZO/Ni, AZO/Ag, IZO/Ag/Ni, AZO/Ag/Ni, using a transmissive conductive material such as IZO, IZTO, IAZO, IGZO, IGTO, AZO and ATO with the metal or the alloy.

The ohmic layer 130 may be disposed between the reflective layer 125 and the second semiconductor layer 152. The ohmic layer 130 may be in an ohmic contact with the second semiconductor layer 152 and, as such, power may be smoothly flow to the light emitting structure 150.

The ohmic layer 130 may be formed using a transmissive conductive layer and a metal, selectively. For example, the ohmic layer 130 may include at least one metal, for example, Ag, Ni, Cr, Ti, Pd, Ir, Sn, Ru, Pt, Au and Hf, in ohmic-contact with the second semiconductor layer 152.

The protective layer 140 may be disposed at the border of the second electrode 105. For example, the protective layer 140 may be disposed at the border of the ohmic layer 130, at the border of the reflective layer 125, at the border of the barrier layer 120 or at the border of the supporting layer 110.

The protective layer 140 may prevent debonding at an interface between the light emitting structure 150 and the second electrode 105. Thus, reliability for the light emitting device 100 is reduced. The protective layer 140 may be made of a non-conductive material, for example, ZnO, SiO2, Si3N4, TiOx (x being a positive real number), Al2O3, or the like.

The current blocking layer 145 may be disposed between the ohmic layer 130 and the light emitting structure 150. The current blocking layer 145 may improve luminous efficacy as distributing current in the light emitting structure 150.

An upper surface of the current blocking layer 145 may contact the second semiconductor layer 152. An under surface, or an under surface and side surfaces of the current blocking layer 145 may contact the ohmic layer 130. The current blocking layer 145 may be disposed such that at least a portion of the current blocking layer 145 overlaps with the first electrode 170 in the vertical direction.

The current blocking layer 145 may be formed between the ohmic layer 130 and the second semiconductor layer 152, or between the reflective layer 125 and the ohmic layer 130, but the disclosure is not limited thereto.

The light emitting structure 150 may be disposed on the ohmic layer 130 and the protective layer 140. Side surfaces of the light emitting structure 150 may become inclined planes in an isolation etching process for separation of unit chips.

The light emitting structure 150 may include the second semiconductor layer 152, an active layer 154, a first semiconductor layer 156 and a light extraction layer 158.

The second semiconductor layer 152, the active layer 154, the first semiconductor layer 156 and the light extraction layer 158 sequentially may be laminated on the ohmic layer 130 and the protective layer.

The second semiconductor layer 152 may be disposed on the ohmic layer 130 and the protective layer 140. The second semiconductor layer 152 may be a semiconductor compound such as a Group III-V semiconductor compound, a Group II-VI semiconductor compound, or the like. A second conductivity type dopant may be doped on the second semiconductor layer 152.

The second semiconductor layer 152 may be a semiconductor having a formula of $In_xAl_yGa_{1-x-y}N$ ($0 \le x \le 1$, $0 \le y \le 1$, $0 \le x+y \le 1$). For example, the second semiconductor layer 152 may include any one of InAlGaN, GaN, AlGaN, InGaN, AlN and InN. A p-type dopant (for example, Mg, Zn, Ca, Sr or Ba) may be doped on the second semiconductor layer 152.

The active layer 154 may be disposed on the second semiconductor layer 152. The active layer 154 may generate through recombination of electrons and holes provided from the first semiconductor layer 156 and the second semiconductor layer 152.

The active layer 154 may be a semiconductor compound such as a Group III-V semiconductor compound, a Group II-VI semiconductor compound, or the like, for example, a compound semiconductor such as a Group III-V compound semiconductor, a Group II-VI compound semiconductor, or the like. The active layer 154 may have a single quantum well structure, a multi quantum well structure, a quantum wire structure, a quantum dot structure, or quantum disk structure.

The active layer 154 may have a formula of $In_xAl_yGa_{1-x-y}N$ ($0 \le x \le 1$, $0 \le y \le 1$, $0 \le x+y \le 1$). When the active layer 154 is a quantum well structure, the active layer 154 may include a well layer (not shown) having a formula of $In_xAl_yGa_{1-x-y}N$ ($0 \le x \le 1$, $0 \le y \le 1$, $0 \le x+y \le 1$) and a barrier layer (not shown) having a formula of $In_aAl_bGa_{1-a-b}N$ ($0 \le a \le 1$, $0 \le b \le 1$, $0 \le a+b \le 1$).

The energy band gaps of the well layer may be smaller than the energy band gaps of the barrier layer. The well layer and barrier layer may be laminated at least once alternately.

The energy band gaps of the well layer and barrier layer may be uniform at each section, but the disclosure is not limited thereto. For example, a composition of indium (In) and/or aluminum (Al) of the well layer may be uniform and a composition of In and/or Al of the barrier layer may be uniform.

Alternately, the energy band gaps of the well layer may include a gradually increasing or decreasing section, and the energy band gaps of the barrier layer may include a gradually increasing or decreasing section. For example, a composition of In and/or Al in the well layer may gradually increase or decrease. In addition, a composition of In and/or Al in the barrier layer may gradually increase or decrease.

The first semiconductor layer 156 may be disposed on the active layer 154. The first semiconductor layer 156 may include a compound semiconductor such as a Group III-V compound semiconductor, a Group II-VI compound semiconductor, or the like. A first conductivity type dopant may be doped on the first semiconductor layer 156.

The first semiconductor layer 156 may be a semiconductor having a formula of $In_xAl_yGa_{1-x-y}N$ ($0 \le x \le 1$, $0 \le y \le 1$, $0 \le x+y \le 1$). The first semiconductor layer 156 may include a nitride semiconductor including Al, for example, any one of InAlGaN, AlGaN, or AlN. An n-type dopant (for example, Si, Ge, Se or Te) may be doped on the first semiconductor layer 156.

A conductive clad layer may be disposed between the active layer 154 and the first semiconductor layer 156, or between the active layer 154 and the second semiconductor layer 152. The conductive clad layer may be a nitride semiconductor (for example, AlGaN, GaN or InAlGaN).

The light emitting structure 150 may further include a third semiconductor layer (not shown) between the second semiconductor layer 152 and a second electrode 205. The third semiconductor layer may have an opposite polarity to the second semiconductor layer 152. In addition, in another embodiment, the first semiconductor layer 156 may be a p-type semiconductor layer, and the second semiconductor layer 152 may be an n-type semiconductor layer. Thus, the light emitting structure 150 may include at least one of N—P, P—N, N—P—N, and P—N—P structures.

The light extraction layer 158 may include an uneven portion. The light extraction layer 158 may be disposed on the first semiconductor layer 156.

Figure 2:
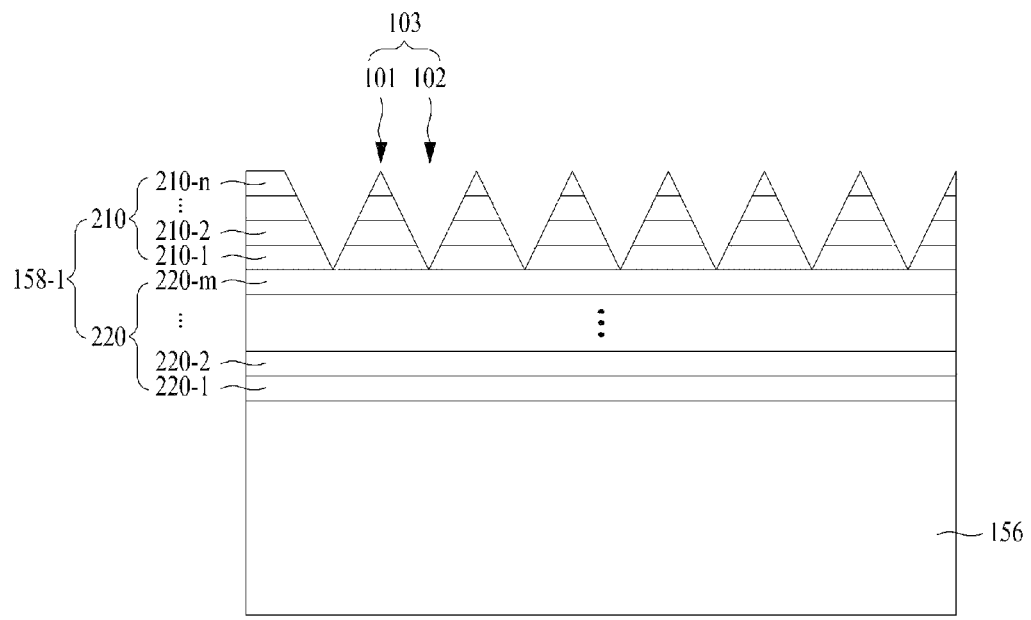
FIG. 2 is a view illustrating a first embodiment of a light extraction layer illustrated in FIG. 1.

FIG. 2 illustrates a first embodiment (158-1) of the light extraction layer 158 shown in FIG. 1.

Referring to FIG. 2, a light extraction layer 158-1 may be made of a nitride semiconductor. The light extraction layer 158-1 may include a plurality of layers 210 and 220 of which the refractive indexes are different each other. The layers 210 and 220 may have a structure laminated sequentially on the first semiconductor layer 156. Each of the layers 210 and 220 may be any one of nitride semiconductors including Al, for example, InAlGaN, AlGaN, or AlN.

The light extraction layer 158-1 may include a first light extraction layer 210 having an uneven portion, which is designated by reference numeral "103", including protruding portions 101 and concave portions 102, and a second light extraction layer 220 disposed between the first light extraction layer 210 and the first semiconductor layer 156.

The refractive index of the light extraction layer 158-1 may be smaller than the refractive index of the first semiconductor layer 156.

The refractive index of the first light extraction layer 210 may be smaller than the refractive index of the first semiconductor layer 156. The refractive index of the second light extraction layer 220 may be smaller than the refractive index of the first semiconductor layer 156.

For example, the refractive index of the first semiconductor layer 156 may be 2 to 3, but the disclosure is not limited thereto.

In addition, an amount of aluminum in the light extraction layer 158-1 may be larger than an amount of aluminum in the first semiconductor layer 156.

The refractive index of the first light extraction layer 210 may be smaller than the refractive index of the second light extraction layer 220. In addition, an amount of aluminum in the first light extraction layer 210 may be larger than an amount of aluminum in the second light extraction layer 220.

The first light extraction layer 210 may include a plurality of first layers (210-1 to 210-n, wherein n is a natural number greater than 1) of which the refractive indexes are different each other. Namely, the protruding portions 101 may have the structure that the first layers (210-1 to 210-n, wherein n is a natural number greater than 1), of which the refractive indexes are different each other, are laminated.

The first layers (210-1 to 210-n, wherein n is a natural number greater than 1) may have the uneven portion 103 including the protruding portions 101 and the concave portions 102. A shape of the uneven portion 103, namely, a shape of the protruding portions 101 may be a cone, pyramid, dome, truncated cone or truncated polygonal pyramid, but the disclosure is not limited thereto.

For example, the refractive index of the first layers (210-1 to 210-n, wherein n is a natural number greater than 1) may reduce toward an upper portion from a lower portion. For example with increasing distance from the first semiconductor layer 156, the refractive index of each of the first layer (210-1 to 210-n, wherein n is a natural number greater than 1) may reduce.

The first layers (210-1 to 210-n, wherein n is a natural number greater than 1) may be any one of nitride semiconductors, for example, InAlGaN, AlGaN or AlN which include Al.

Each of the first layers (210-1 to 210-n, wherein n is a natural number greater than 1) may be made of a nitride semiconductor including Al having an identical composition, but an amount of Al in the first layers may be different.

An amount of Al in the first layers (210-1 to 210-n, wherein n is a natural number greater than 1) may increase toward an upper portion from a lower portion. For example, with increasing distance from the first semiconductor layer 156, an amount of Al in each of the first layers (210-1 to 210-n, wherein n is a natural number greater than 1) may increase. Difference of an amount of Al in the first layers adjacent may be 10% or less. When difference of an amount of Al in the first layers adjacent is greater than 10%, light extraction efficiency may not be improved significantly.

The second light extraction layer 220 may include a plurality of second layers (220-1 to 220-m, wherein m is a natural number greater than 1), each of which has a different refractive index. The second layers (220-1 to 220-m, wherein m is a natural number greater than 1) may be even layers not including the uneven portion.

For example, the refractive indexes of the second layers (220-1 to 220-m, wherein m is a natural number greater than 1) may reduce toward an upper portion from a lower portion. For example, with increasing distance from the first semiconductor layer 156, the refractive index of each of the second layers (220-1 to 220-m, wherein m is a natural number greater than 1) may reduce.

The second layers (220-1 to 220-m, wherein m is a natural number greater than 1) may be any one of nitride semiconductors including Al, for example, InAlGaN, AlGaN or AlN.

Each of the second layers (220-1 to 220-m, wherein m is a natural number greater than 1) may be made of nitride semiconductors including Al, having an identical composition, but an amount of Al in the second layers may be different.

An amount of Al in the second layers (220-1 to 220-m, wherein m is a natural number greater than 1) may increase toward an upper portion from a lower portion. For example, with increasing distance from the first semiconductor layer 156, an amount of Al in each of the second layers (220-1 to 220-m, wherein m is a natural number greater than 1) may increase.

Figure 3:
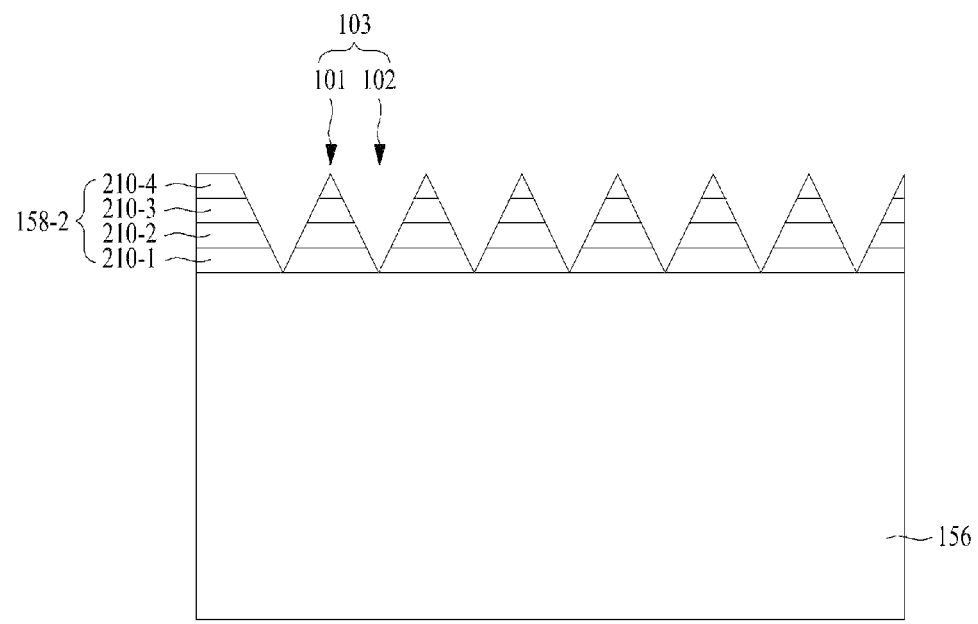
FIG. 3 is a view illustrating a second embodiment of the light extraction layer illustrated in FIG. 1.

FIG. 3 illustrates a second embodiment 158-2 of the light extraction layer 158 shown in FIG. 1. Referring to FIG. 3, the second light extraction layer 220 shown in FIG. 2 is omitted in a light extraction layer 158-2. The light extraction layer 158-2 only includes the first light extraction layer 210 disposed on the first semiconductor layer 156.

The light extraction layer 158-2 may include the first layers (210-1 to 210-n, namely, wherein n is a natural number greater than 1), each of which has a different refractive index. Namely, the protruding portions 101 may be a structure that the first layers (210-1 to 210-n, wherein n is a natural number greater than 1), each of which has a different refractive index, are laminated.

For example, the refractive index of the first layers (210-1 to 210-n, wherein n is a natural number greater than 1) may reduce toward an upper portion from a lower portion. For example, with increasing distance from the first semiconductor layer 156, the refractive index of the first layers (210-1 to 210-n, wherein n is a natural number greater than 1) may reduce.

In addition, an amount of Al in the first layers (210-1 to 210-n, wherein n is a natural number greater than 1) may increase toward an upper portion from a lower portion. For example, with increasing distance from the first semiconductor layer 156, an amount of Al in the first layers (210-1 to 210-n, wherein n is a natural number greater than 1) may increase.

For example, the light extraction layer 158-2 may include three to six first layers (210-1 to 210-n, namely, 3≤n≤6). For anti-reflection, the thickness of each of the first layers (210-1 to 210-n, namely, 3≤n≤6) may be a multiple of $\lambda/(4*n)$. Here, λ is a wavelength of light and n is the refractive index of the first layers. Difference of an amount of Al in the first layers adjacent may be 10% or less.

Figure 4:
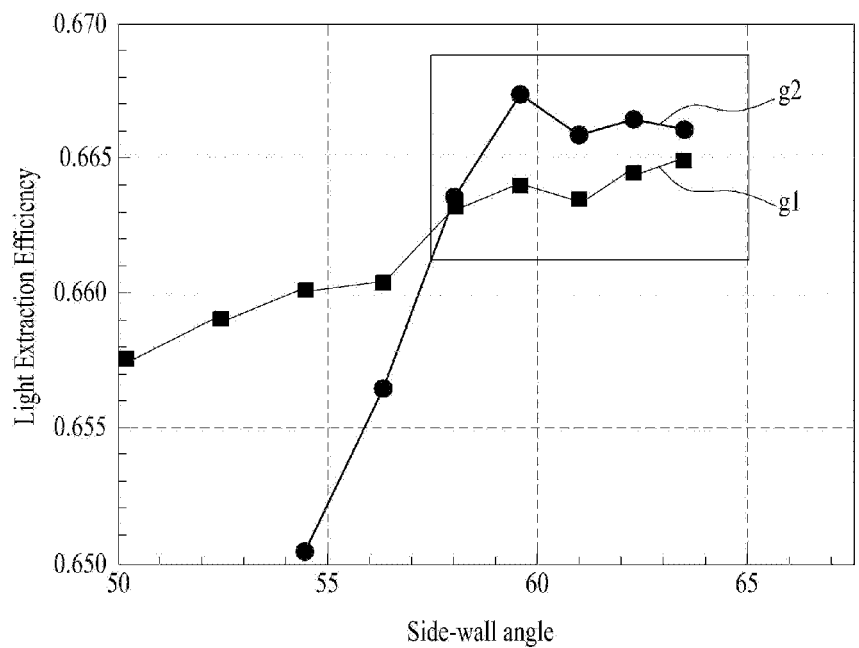
FIG. 4 is a view illustrating light extraction efficiency of a light emitting device having the light extraction layer according to the second embodiment.

FIG. 4 illustrates a light extraction efficiency of the light emitting device 100 having the light extraction layer 158-2 according to a second embodiment. g1 represents a light extraction efficiency of the light emitting device including the uneven portion structure having an identical refractive index. g2 represents a light extraction efficiency of the second embodiment.

Referring to FIG. 4, the number of the first layers (210-1 to 210-n, wherein n is a natural number greater than 1) included in the light extraction layer 158-2 is 3. A composition of each of the first layers (210-1 to 210-n, wherein n is a natural number greater than 1) is AlGaN. The refractive index of the first semiconductor layer 156 is 2.49, the refractive index of a first layer (210-1) locating at the lowermost may be 2.2, a refractive index of a first layer (210-2) locating in the middle may be 2.0, and a refractive index of a first layer (210-3) locating at the uppermost may be 1.8. In addition, the thickness of each of the first layers (210-1 to 210-3) may be 100 nm.

A shape of the uneven portion, namely, a shape of the protruding portions 101 may be a pyramid shape. When a sidewall angle of the protruding portions 101 is large, a light extraction efficiency of the protruding portions 101 may increase. When the sidewall angle of the protruding portions 101 is 58°~65°, a light extraction efficiency of g2 is higher than a light extraction efficiency of g1. In the second embodiment, the light extraction efficiency may be improved as adding the light extraction layer 158 including a plurality of layers, each of which has a different refractive index.

In order to protect the light emitting structure 150 electrically, the passivation layer 165 may be disposed at side surfaces of the light emitting structure 150. In addition, the passivation layer 165 may be disposed on a portion of an upper surface of the first semiconductor layer 156 or an upper surface of the protective layer 140. The passivation layer 165 may be made of an insulating material, for example, SiO2, SiOx, SiOxNy, Si3N4 or Al2O3.

A first electrode 470 may be disposed on the light emitting structure 150, namely, the first semiconductor layer 156. The first electrode 170 may be a certain pattern type to distribute current.

Figure 5:
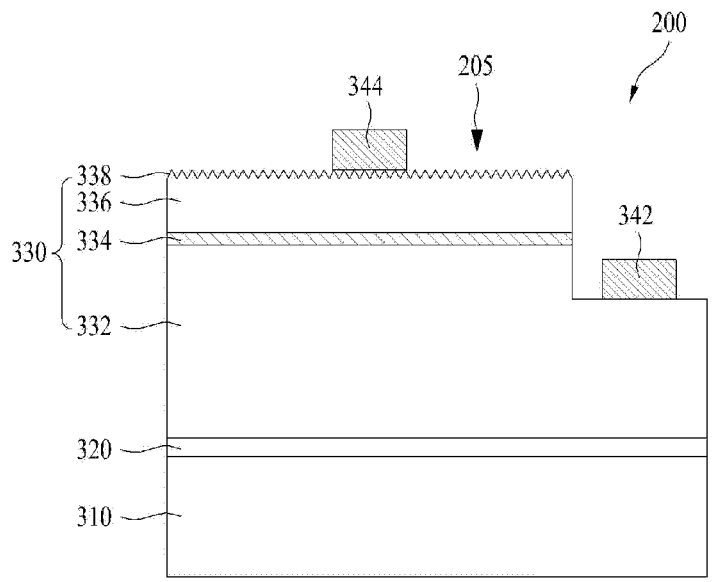
FIG. 5 is a sectional view of a light emitting device according to another embodiment.
Figure 6:
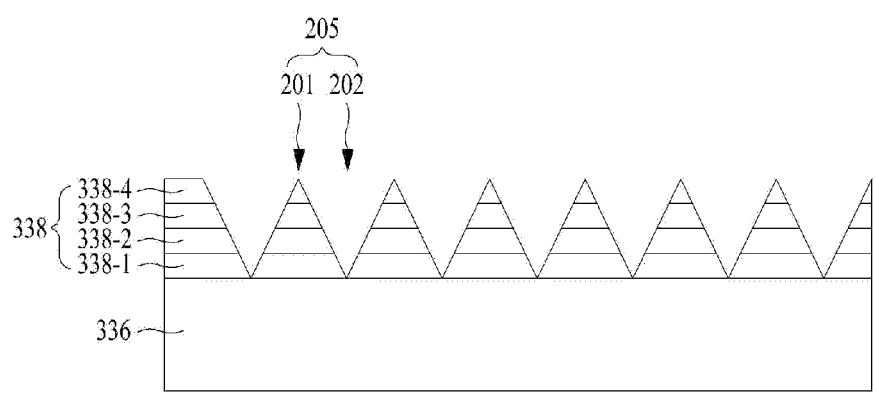
FIG. 6 is a view illustrating an embodiment of a light extraction layer illustrated in FIG. 5.

FIG. 5 illustrates a sectional view of a light emitting device 200 according to another embodiment. FIG. 6 illustrates an embodiment of a light extraction layer 338 shown in FIG. 5. Referring to FIG. 5, the light emitting device 200 may include a substrate 310, a buffer layer 320, a light emitting structure 330, a first electrode 342 and a second electrode 344.

The substrate 310 may be made of a material suitable for growth of a semiconductor material, namely, carrier wafer. In addition, the substrate 310 may be made of a material having excellent thermal conductivity and may be a conductive or insulating substrate. For example, the substrate 310 may be a material including at least one of sapphire (Al2O3), GaN, SiC, ZnO, Si, GaP, InP, Ga2O3, or GaAs. An uneven pattern may be formed on an upper surface of the substrate 310.

To reduce lattice constant difference, the buffer layer 320 may be disposed between the substrate 310 and the light emitting structure 330. The buffer layer 320 may be made of a Group II-VI compound semiconductor.

The light emitting structure 330 may be a semiconductor layer generating light. The light emitting structure 330 may include a first semiconductor layer 332, an active layer 334, a second semiconductor layer 336 and the light extraction layer 338.

The first semiconductor layer 322, the active layer 324 and the second semiconductor layer 326 may be identical to the first semiconductor layer 156, the active layer 154 and the second semiconductor layer 152, described in FIG. 1, respectively.

The light extraction layer 338 may include the uneven portion, which is designated by reference numeral "205". The light extraction layer 338 may be disposed on the second semiconductor layer 336.

The light extraction layer 338 may include a plurality of first layers (338-1 to 338-m, wherein m is a natural number greater than 1), each of which has a different refractive index. The first layers (338-1 to 338-m, wherein m is a natural number greater than 1) may be a structure that the first layers are sequentially laminated on the second semiconductor layer 336. The first layers (338-1 to 338-m, wherein m is a natural number greater than 1) may have the uneven portion 205 including protruding portions 201 and concave portions 202.

For example, the protrude portion 201 may be a structure that the first layers (338-1 to 338-m, wherein m is a natural number greater than 1), each of which has a different refractive index, are laminated. Here, a shape of the uneven portion 205, namely, a shape of the protrude portion 201, may be a cone, pyramid, dome or truncated cone shape, but the disclosure is not limited thereto.

Each of the first layers (338-1 to 338-m, wherein m is a natural number greater than 1) may be any one of nitride semiconductors including Al, for example, InAlGaN, AlGaN or AlN.

The refractive index of the light extraction layer 338 may smaller than the refractive index of the second semiconductor layer 336. For example, the refractive index of the second semiconductor layer 336 may be 2 to 3, but the disclosure is not limited thereto. In addition, an amount of Al in the light extraction layer 338 may be larger than an amount of Al in the second semiconductor layer 336.

For example, the refractive indexes of the first layers (338-1 to 338-m, wherein m is a natural number greater than 1) may reduce toward an upper portion from a lower portion. For example, with increasing distance from the second semiconductor layer 336, the refractive indexes of the first layers (338-1 to 338-m, wherein m is a natural number greater than 1) may reduce.

In addition, an amount of Al in the first layers (338-1 to 338-m, wherein m is a natural number greater than 1) may increase toward an upper portion from a lower portion. For example, with increasing distance from the second semiconductor layer 336, an amount of Al in the first layers (338-1 to 338-m, wherein m is a natural number greater than 1) may increase. Difference of an amount of Al in the first layers adjacent may be 10% or less.

The light emitting structure 330 may expose a portion of the first semiconductor layer 332 by removing a portion of the light extraction layer 338, the second semiconductor layer 336, the active layer 334 and the first semiconductor layer 332. The first electrode 342 may be disposed on the first semiconductor layer 332 exposed. The second electrode 344 may be disposed on the second semiconductor layer 336.

Although it is not illustrated in FIG. 5, a conductive layer (not shown) may be disposed on the light extraction layer 338 in order to prevent total reflection. The conductive layer (not shown) may have a single layer or multiple layers using at least one of transparent conductive oxides, namely, ITO (Indium Tin Oxide), TO (Tin Oxide), IZO (Indium Zinc Oxide), ITZO (Indium Tin Zinc Oxide), IAZO (Indium Aluminum Zinc Oxide), IGZO (Indium Gallium Zinc Oxide), IGTO (Indium Gallium Tin Oxide), AZO (Aluminum Zinc Oxide), ATO (Antimony tin Oxide), GZO (Gallium Zinc Oxide), IrOx, RuOx,RuOx/ITO, Ni, Ag, Ni/IrOx/Au or Ni/IrOx/Au/ITO.

A light emitting device according to another embodiment may include a light extraction layer having a same structure as shown in FIG. 2. The light emitting device 200 according to the embodiment may improve light extraction efficiency by the light extraction layer 338.

Figure 7:
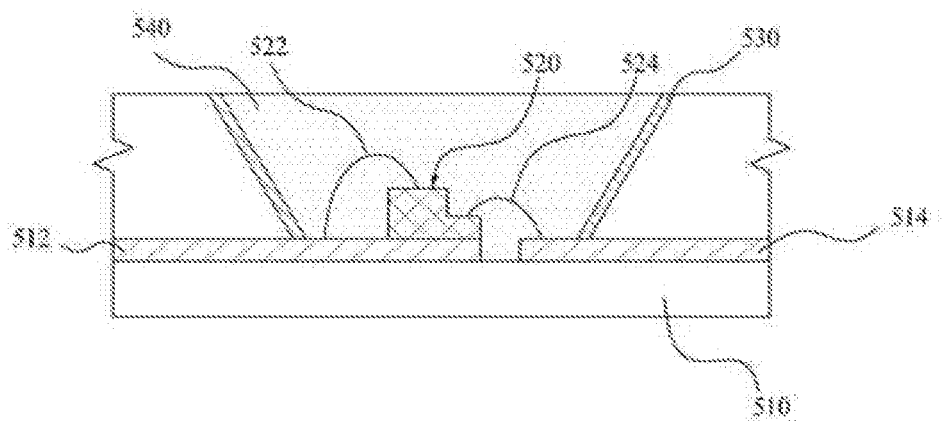
FIG. 7 is a view illustrating a light emitting device package according to an embodiment.

FIG. 7 illustrates a light emitting device package according to the embodiment. Referring to FIG. 7, the light emitting device package includes a package body 510, a first conductive layer 512, a second conductive layer 514, a light emitting device 520, a reflective plate 530, a wire 530 and a resin layer 540.

The package body 510 may be made of a substrate having excellent insulating property or thermal conductivity such as silicone-based wafer level package, silicone substrate, silicon carbide (SiC), aluminum nitride (AlN), or the like. The package body 510 may be a structure that a plurality of substrates is laminated. However, embodiments are not limited to the material, structure and shape of the package body 510 described previously.

The package body 510 may have a cavity constituted by side surfaces and a bottom at one side region of an upper surface of the package body 510. Here, side walls of the cavity may be inclined.

The first conductive layer 512 and the second conductive layer 514 are disposed at the surface of the package body 510 to be electrically isolated from each other, considering heat exhaust or equipment of a light emitting device. The light emitting device 520 is connected electrically to the first conductive layer 512 and the second conductive layer 514. Here, the light emitting device 520 may be any one of the embodiments 100 and 200.

The reflective plate 530 may be disposed at side walls of a cavity in the package body 510 such that the reflective plate 530 is toward light emitted from the light emitting device 520. The reflective plate 530 may be a light reflecting material. For example, the reflective plate 530 may be formed by metal coating or may be a metal sheet.

The resin layer 540 surrounds the light emitting device 520 locating inside the cavity of the package body 510 to protect the light emitting device 520 from external environment. The resin layer 540 may be made of a colorless and transparent polymer resin material such as epoxy or silicone. The resin layer 540 may include a phosphor to change light emitted from the light emitting device 520.

A plurality of the light emitting device packages according to the embodiment may be arrayed on the substrate. Optical members such as light guide plates, prism sheets, diffusion sheets, or the like may be disposed on optical paths of the light emitting device package. The light emitting device package, substrate and optical members may function as a backlight unit.

In accordance with another embodiment, a display apparatus, an indication apparatus or a lighting system may be implemented using the light emitting devices or light emitting device packages described in conjunction with the above-described embodiments. The lighting system may include, for example, a lamp or a street lamp.

Figure 8:
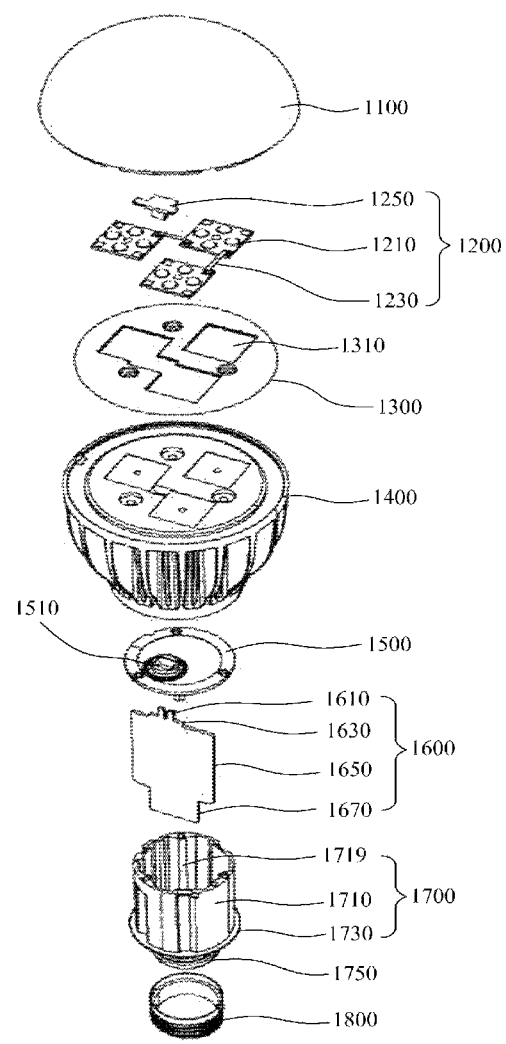
FIG. 8 is a view illustrating a lighting apparatus including the light emitting device package according to the embodiment.

FIG. 8 illustrates a lighting apparatus including a light emitting device according to an embodiment. Referring to FIG. 8, the lighting apparatus may include a cover 1100, a light source module 1200, a heat sink 1400, a power supply 1600, an inner case 1700 and a socket 1800. In addition, the lighting apparatus according to the embodiment may include at least one of a member 1300 and a holder 1500.

The light source module 1200 may include the light emitting device (100 or 200), or the light emitting device package according to the embodiment.

The cover 1100 may have a bulb or hemispherical shape. In addition, the cover 1100 may be hollow inside or a part of cover 1100 may be open. The cover 1100 optically may bind to the light source module 1200. For example, the cover 1100 may diffuse, scatter or excite light provided from the light source module 1200. The cover 1100 may be a kind of optical members. The cover 1100 may be bonded to the heat sink 1400. The cover 1100 may have a binding portion binding to the heat sink 1400.

Inner surfaces of the cover 1100 may be coated with milky paint. The milky paint may include a diffusion material diffusing light. Roughness of inner surfaces of the cover 1100 may be larger than roughness of outer surfaces of the cover 1100. This is to scatter and diffuse light from the light source module 1200 sufficiently and, as such, to emit the light to the outside.

A material of the cover 1100 may be glass, plastic, polypropylene (PP), polyethylene (PE), polycarbonate (PC), or the like. Here, the light resistance, heat resistance and strength of polycarbonate are excellent. The cover 1100 may be transparent such that the light source module 1200 may be viewed from the outside, but the disclosure is not limited thereto. The cover 1100 may also be opaque. The cover 1100 may be formed by blow molding.

The light source module 1200 may be disposed at one side of the heat sink 1400. Heat generated from the light source module 1200 may be conducted to the heat sink 1400. The light source module 1200 may include light source parts 1210, a connection plate 1230 and a connector 1250.

The member 1300 may be disposed on an upper surface of the heat sink 1400. The member 1300 has guide grooves 1310 where a plurality of the light source parts 1210, and the connector 1250 are inserted. The guide grooves 1310 may correspond to or be arranged with a substrate of the light source parts 1210 and the connector 1250.

A surface of the member 1300 may be painted or coated with a light reflecting material. For example, a surface of the member 1300 may be painted or coated with white paint. The member 1300 may reflect light, which is reflected at inner surfaces of the cover 1100 and returns toward the light source module 120, toward the cover 1100. Thus, luminous efficacy of the lighting apparatus according to the embodiment may be improved.

The member 1300 may be made of, for example, an insulating material. The connection plate 1230 of the light source module 1200 may include an electrically conductive material. Thus, electrical contact may be formed between the heat sink 1400 and the connection plate 1230. The member 1300 may be made of an insulating material to prevent electrical short circuit between the connection plate 1230 and the heat sink 1400. The heat sink 1400 may receive and radiate heat from the light source module 1200 and heat from the power supply 1600.

The holder 1500 blocks a receiving recess 1719 of an insulating portion 1710 in the inner case 1700. Thus, the power supply 1600 accommodated in the insulating portion 1710 of the inner case 1700 may be sealed. The holder 1500 may have a guide protruding portion 151. The guide protruding portion 1510 may have a hole that a protruding portion 1610 of the power supply 1600 penetrates.

The power supply 1600 processes or converts an electrical signal provided from the outside to provide to the light source module 1200. The power supply 1600 may be accommodated in the receiving recess 1719 of the inner case 1700. The power supply 1600 may be sealed with the holder 1500 of the inner case 170. The power supply 1600 may include the protruding portion 1610, a guide portion 1630, a base 1650 and an extension portion 1670.

The guide portion 1630 may be a shape protruding outwardly from one side of the base 1650. The guide portion 1630 may be inserted into the holder 1500. A plurality of components may be disposed on one side of the base 1650. The components may include, for example, a direct current (DC) conversion device which converts alternating current (AC) power provided from an external source into DC power, a driver chip which controls driving of the light source module 1200, an electrostatic discharge (ESD) protection device to protect the light source module 1200, and the like, but the disclosure is not limited thereto.

The extension portion 1670 may have a shape protruded outwardly at another side of the base 1650. The extension portion 1670 may be inserted inside a connection portion 1750 of the inner case 1700 and may receive electrical signals from the outside. For example, the width of the extension portion 1670 is the same as or smaller than the width of the connection portion 1750 of the inner case 1700. One end of each of "+ wire" and "− wire" may be electrically connected to the extension portion 1670. The other end of each of "+ wire" and "− wire" electrically may be connected to the socket 1800.

Inside the inner case 1700, a molding part with the power supply 1600 may be included. The molding part is formed by hardening of molding liquid. Thus, by the molding part, the power supply 1600 may be fixed inside the inner case 1700.

Figure 9:
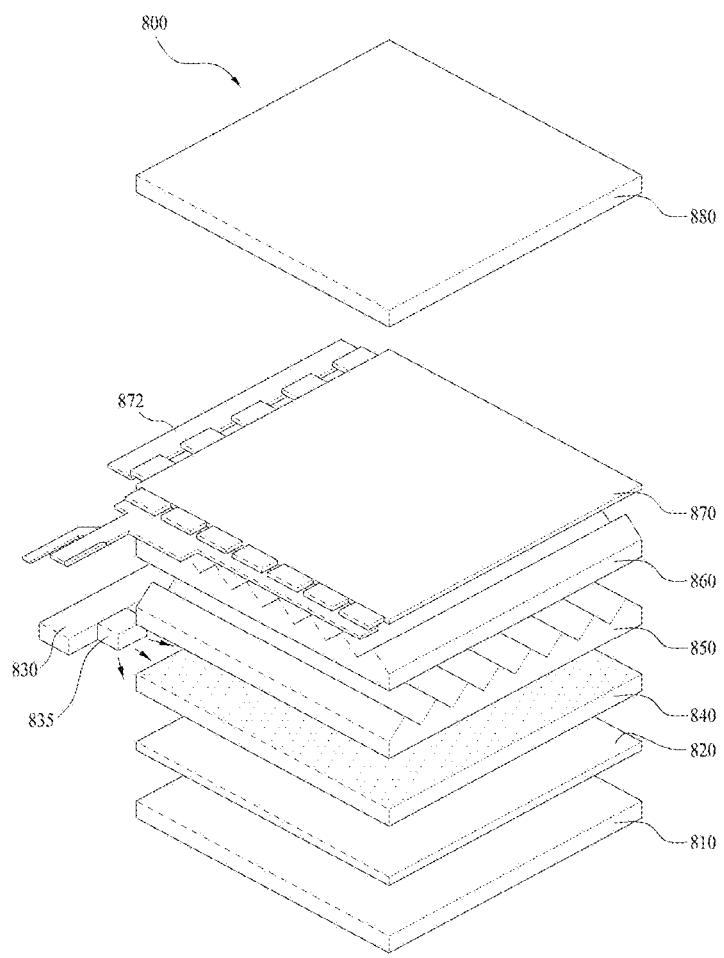
FIG. 9 is a view illustrating a display apparatus including the light emitting device package according to the embodiment.

FIG. 9 illustrates a display apparatus including the light emitting device package according to an embodiment. Referring to FIG. 9, the display apparatus, which is designated by reference numeral "800", may include a bottom cover 810, a reflective plate 820 disposed on the bottom cover 810, light emitting modules 830 and 835 emitting light, a light guide plates 840 disposed in front of the reflective plate 820 and guiding light emitted from the light emitting modules 830 and 835 to the front of the display apparatus, an optical sheet including prism sheets 850 and 860 disposed in front of a light guide plate 840, a display panel 870 disposed in front of the optical sheet, an image signal output circuit 872 being connected to the display panel 870 and providing image signals to the display panel 870, and a color filter 880 disposed in front of the display panel 870. Here, the backlight unit may include the bottom cover 810, the reflective plate 820, the light emitting modules 830 and 835, the light guide plate 840, and the optical sheet.

The light emitting modules 830 and 835 may include light emitting device packages 835 mounted on a substrate 830. Here, the substrate 830 may be made of PCB, or the like. The light emitting device packages 835 may be the embodiment illustrated in FIG. 7.

The bottom cover 810 may receive constituent elements in a display apparatus 800. The reflective plate 820 may be provided as a separate element, as shown in FIG. 7, or may be formed by coating a material having high reflectivity over a rear surface of the light guide plate 840 or over a front surface of the bottom cover 810.

Here, the reflective plate 820 may be made of a material having high reflectivity and capable of being formed into an ultra thin structure. Polyethylene terephthalate (PET) may be used for the reflective plate 820. The light guide plate 830 may be made of polymethylmethacrylate (PMMA), polycarbonate (PC), polyethylene (PE), or the like.

The first prism sheet 850 may be formed by coating a polymer exhibiting light transmittance and elasticity over one surface of a base film. The first prism sheet 850 may have a prism layer having a plurality of three-dimensional structures in the form of a repeated pattern. Here, the pattern may be of a stripe type in which ridges and valleys are repeated.

The second prism sheet 860 may have a similar structure to the first prism sheet 850. The second prism sheet 860 may be configured such that the orientation direction of ridges and valleys formed on one surface of the base film of the second prism sheet 860 is perpendicular to the orientation direction of the ridges and valleys formed on one surface of the base film of the first prism sheet 850. Such a configuration serves to uniformly distribute light transmitted from the light source modules 830 and 835 and the reflective plate 820 toward the entire surface of the panel 870.

Although it is not shown in FIG. 9, a diffusion sheet may be disposed between the light guide plate 840 and the first prism sheet 850. The diffusion sheet may be made of a polyester and polycarbonate-based material. The diffusion sheet may extend an incident angle of light incident from the backlight unit by refraction and scattering, to max. The diffusion sheets may include a supporting layer including a light diffusion agent, and a first and second layer which are formed on a light emission face (toward the first prism sheet) and light incident face (toward the reflective sheet) and do not include a first layer and second layer.

In accordance with an embodiment, the optical sheet may be constituted by the diffusion sheet, first prism sheet 850 and second prism sheet 860. However, the optical sheet may include other combinations, for example, a microlens array, a combination of a diffusion sheet and a microlens array, and a combination of a prism sheet and a microlens array.

Figure 10:
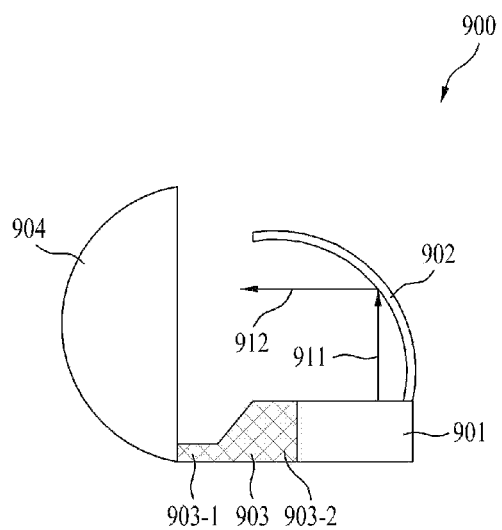
FIG. 10 is a view illustrating a headlamp including the light emitting device package according to the embodiment.

A liquid crystal display panel may be used as the display panel 870. Further, instead of the liquid crystal display panel 870, other kinds of display devices requiring light sources may be provided FIG. 10 illustrates a headlamp 900 including the light emitting device package according to the embodiment. Referring to FIG. 10, the headlamp 900 includes a light emitting module 901, reflector 902, shade 903 and lens 904.

The light emitting module 901 may include light emitting device packages (not shown) disposed on a substrate (not shown). Here, the light emitting device packages may be the embodiment shown in FIG. 7.

The reflector 902 may reflect light 911 projected from the light emitting module 901 to a constant direction, for example, forwardly 912.

The shade 903 is disposed between the reflector 902 and the lens 904. The shade 903 is a member forming light distribution pattern, which a designer desires, by blocking or reflecting a portion of light directed to the lens 904, after being reflected by the reflector 902. Thus, the levels of one side portion 903-1 and the other portion 903-2 of the shade 903 may be different each other.

Light projected from the light emitting module 901 passes through the lens 904 after being reflected by the reflector 902 and the shade 903, so as to be directed forwardly of a vehicle body. The lens 904 may refract light reflected by the reflector 902, forwardly.

Particular characteristics, structures, or effects described in connection with the embodiment are included in at least one embodiment of the present disclosure and not necessarily in all embodiments. Furthermore, the particular characteristics, structures, or effects of any specific embodiment of the present disclosure may be combined in any suitable manner with one or more other embodiments or may be changed by those skilled in the art to which the embodiments pertain.

Therefore, it is to be understood that contents associated with such combination or change fall within the spirit and scope of the present disclosure.

As is apparent from the above description, light extraction efficiency may be improved according to embodiments.

Particular characteristics, structures, or effects described in connection with the embodiment are included in at least one embodiment of the present disclosure and not necessarily in all embodiments. Furthermore, the particular characteristics, structures, or effects of any specific embodiment of the present disclosure may be combined in any suitable manner with one or more other embodiments or may be changed by those skilled in the art to which the embodiments pertain. Therefore, it is to be understood that contents associated with such combination or change fall within the spirit and scope of the present disclosure.

Embodiments provide a light emitting device exhibiting improved light extraction efficiency.

In one embodiment, a light emitting device includes a first semiconductor layer, a second semiconductor layer, an active layer disposed between the first semiconductor layer and the second semiconductor layer, and a first light extraction layer disposed on the first semiconductor layer and including a nitride semiconductor layer, wherein the first light extraction layer includes first layers, and refractive indexes of the first layers reduce with increasing distance from the first semiconductor layer.

The light emitting device may further include a second light extraction layer disposed between the first light extraction layer and the first semiconductor layer, and including a nitride semiconductor, wherein the second light extraction layer includes a plurality of second layers, and refractive indexes of the second layers reduce with increasing distance from the first semiconductor layer.

A refractive index of the first light extraction layer may be smaller than a refractive index of the first semiconductor layer.

A refractive index of the second light extraction layer may be smaller than a refractive index of the first semiconductor layer.

The first layers may include the nitride semiconductor including aluminum having identical composition, and an amount of aluminum in the first layers may be varied.

The second layers may include the nitride semiconductor including aluminum having identical composition, and an amount of aluminum in the second layers may be varied.

An amount of aluminum in the first layers may increase with increasing distance from the first semiconductor layer.

An amount of aluminum in the second layers may increase with increasing distance from the first semiconductor layer.

Difference of an amount of aluminum in the first layers adjacent may be 10% or less.

The first semiconductor layer may include same materials as materials of the first layers, and an amount of aluminum in the first semiconductor layer may be smaller than an amount of aluminum in each of the first layers.

The first and second light extraction layers may include nitride semiconductors including aluminum, and an amount of aluminum in the first and second light extraction layers may be larger than an amount of aluminum in the first semiconductor layer.

Thickness of each of the first layers may be a multiple of $\lambda/4*n$), wherein $\lambda$ is a wavelength of light and n is a refractive index of each of the first layers. The first layers may include three to six layers.

The light emitting device may further include a first electrode disposed on the first semiconductor layer, and a second electrode disposed under the second semiconductor layer, wherein the second electrode includes an ohmic layer disposed under the second semiconductor layer, a reflective layer disposed under the ohmic layer, and a supporting layer disposed under the reflective layer.

The light emitting device may further include a substrate disposed under the first semiconductor layer, a first electrode disposed on the first semiconductor layer, and a second electrode disposed on the second semiconductor layer.

In another embodiment, a light emitting device includes a first semiconductor layer, a second semiconductor layer, an active layer disposed between the first semiconductor layer and the second semiconductor layer, a first light extraction layer disposed on the first semiconductor layer and including an uneven portion including convex and concave portions, and a second light extraction layer disposed between the first light extraction layer and the first semiconductor layer, wherein the convex portions of the first light extraction layer includes first layers, wherein the first layers are any one of InAlGaN, AlGaN or AlN, and wherein a refractive index of each of the first layers is reduced with increasing distance from the first semiconductor layer. An angle of side walls of the convex portions may be 58° to 65°.

An amount of aluminum in each of the first layers may increase with increasing distance from the first semiconductor layer.

The second light extraction layer may include second layers, the second layers are any one of InAlGaN, AlGaN or AlN, and a refractive index in each of the second layers reduces with increasing distance from the first semiconductor layer.

An amount of aluminum in each of the second layers may increase with increasing distance from the first semiconductor layer. The convex portions may include a cone, pyramid, dome, truncated cone or truncated polygonal pyramid shape.

In another embodiment, a light emitting device package includes a package body, a first conductive layer and second conductive layer disposed on the package body, and a light emitting device connected electrically to the first conductive layer and the second conductive layer, wherein the light emitting device includes a first semiconductor layer, a second semiconductor layer, an active layer disposed between the first semiconductor layer and the second semiconductor layer, and a first light extraction layer disposed on the first semiconductor layer and including a nitride semiconductor layer, and wherein the first light extraction layer includes first layers, and refractive indexes of the first layers reduce with increasing distance from the first semiconductor layer.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a first semiconductor layer;
a second semiconductor layer;
an active layer provided between the first semiconductor layer and the second semiconductor layer;
a first light extraction layer provided on the first semiconductor layer and including a first nitride semiconductor; and
a second light extraction layer provided between the first light extraction layer and the first semiconductor layer and including a second nitride semiconductor,
wherein the first light extraction layer includes protruding portions and concave portions, each protruding portion having a plurality of first layers which are laminated to form a pyramid structure, wherein refractive indexes of the first layers decrease with increasing distance from the first semiconductor layer, wherein the second light extraction layer includes a plurality of second layers, and each of the second layers is substantially flat and does not include an unevenness, wherein refractive indexes of the second layers decrease with increasing distance from the first semiconductor layer, wherein at least two adjacent protruding portions of the first layers are provided over the second light extraction layer, wherein the refractive index of each first layer is different from the refractive indexes of the other first layers, wherein an angle of a side wall of each of the protruding portions with respect to an upper surface of the second light extraction layer is 58° to 65°, wherein a thickness of each of the first layers is a multiple of $\lambda/(4*n)$, and wherein $\lambda$ is a wavelength of light and n is a refractive index of each of the first layers.

2. The light emitting device according to claim 1, wherein the protruding portions are in contact with each other.

3. The light emitting device according to claim 1, wherein a refractive index of the first light extraction layer is smaller than a refractive index of the first semiconductor layer.

4. The light emitting device according to claim 1, wherein a refractive index of the second light extraction layer is smaller than a refractive index of the first semiconductor layer.

5. The light emitting device according to claim 1, wherein the first nitride semiconductor includes aluminum, and an amount of aluminum in the first nitride semiconductor in a first layer of the first layers is different from an amount of aluminum in the first nitride semiconductor in a second layer of the first layers.

6. The light emitting device according to claim 1, wherein the second nitride semiconductor includes aluminum, and an amount of aluminum in the second nitride semiconductor in a first layer of the second layers is different from an amount of aluminum in the second nitride semiconductor in a second layer of the second layers.

7. The light emitting device according to claim 5, wherein the amount of aluminum in the first layers increases with increasing distance from the first semiconductor layer.

8. The light emitting device according to claim 6, wherein the amount of aluminum in the second layers increases with increasing distance from the first semiconductor layer.

9. The light emitting device according to claim 7, wherein a difference of the amount of aluminum in adjacent layers of the first layers is 10% or less.

10. The light emitting device according to claim 5, wherein the first semiconductor layer includes a same material as a material included in the first layers, and an amount of aluminum in the first semiconductor layer is smaller than an amount of aluminum in each of the first layers.

11. The light emitting device according to claim 1, wherein the first and second nitride semiconductors include aluminum, and an amount of aluminum in the first and second nitride semiconductors is larger than an amount of aluminum in the first semiconductor layer.

12. The light emitting device according to claim 1, further including:
a first electrode provided on the first semiconductor layer; and
a second electrode provided under the second semiconductor layer,
wherein the second electrode has an ohmic layer provided under the second semiconductor layer, a reflective layer provided under the ohmic layer, and a supporting layer provided under the reflective layer.

13. The light emitting device according to claim 1, further including:
a substrate provided under the first semiconductor layer;
a first electrode provided on the first semiconductor layer; and
a second electrode provided on the second semiconductor layer.

14. The light emitting device according to claim 1, wherein a corresponding concave portion is provided between adjacent protruding portions.

15. A light emitting device comprising:
a first semiconductor layer;
a second semiconductor layer;
an active layer provided between the first semiconductor layer and the second semiconductor layer;
a first light extraction layer provided on the first semiconductor layer, the first light extraction layer including an uneven portion that includes convex and concave portions; and
a second light extraction layer provided between the first light extraction layer and the first semiconductor layer, wherein the convex portions of the first light extraction layer include first layers, wherein the first layers are any one of InAlGaN, AlGaN, or AlN, wherein a refractive index of each of the first layers is decreased with increasing distance from the first semiconductor layer, wherein the second light extraction layer includes second layers and the second layers are any one of InAlGaN, AlGaN, or AlN, wherein each of the second layers is substantially flat and does not include an unevenness, wherein a refractive index in each of the second layers decreases with increasing distance from the first semiconductor layer, wherein at least one concave portion of the first light extraction layer is provided over the second light extraction layer, wherein each of the convex portions has a pyramid structure such that the first layers are laminated, wherein the refractive index of each first layer is different from the refractive indexes of the other first layers, wherein an angle of a side wall of each of the convex portions with respect to an upper surface of the second light extraction layer is 58° to 65°, wherein a thickness of each of the first layers is a multiple of $\lambda/(4*n)$, and wherein $\lambda$ is a wavelength of light and n is a refractive index of each of the first layers.

16. The light emitting device according to claim 15, wherein an amount of aluminum in each of the first layers increases with increasing distance from the first semiconductor layer.

17. The light emitting device according to claim 15, wherein the convex portions are in contact with each other.

18. The light emitting device according to claim 17, wherein an amount of aluminum in each of the second layers increases with increasing distance from the first semiconductor layer.

19. A light emitting device package comprising:
a package body;
a first conductive layer and a second conductive layer provided on the package body; and
a light emitting device connected electrically to the first conductive layer and the second conductive layer, wherein the light emitting device includes a first semiconductor layer, a second semiconductor layer, an active layer provided between the first semiconductor layer and the second semiconductor layer, a first light extraction layer provided on the first semiconductor layer and including a nitride semiconductor, and a second light extraction layer provided between the first light extraction layer and the first semiconductor layer and including a nitride semiconductor, wherein the first light extraction layer has protruding portions and concave portions, each protruding portion having a plurality of first layers which are laminated to form a pyramid structure, wherein refractive indexes of the first layers decrease with increasing distance from the first semiconductor layer, wherein the second light extraction layer includes a plurality of second layers, and each of the second layers is substantially flat and does not include an unevenness, and refractive indexes of the second layers decrease with increasing distance from the first semiconductor layer, wherein at least one concave portion of the first light extraction layer is provided over at least one of the second layers, wherein the refractive index of each first layer is different from the refractive indexes of the other first layers, wherein an angle of a side wall of each of the protruding portions with respect to an upper surface of the second light extraction layer is 58° to 65°, wherein a thickness of each of the first layers is a multiple of $\lambda/(4*n)$, and wherein $\lambda$, is a wavelength of light and n is a refractive index of each of the first layers.

* * * * *